United States Patent
Kuraguchi

(10) Patent No.: US 8,729,558 B2
(45) Date of Patent: May 20, 2014

(54) NITRIDE SEMICONDUCTOR DEVICE

(75) Inventor: Masahiko Kuraguchi, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 93 days.

(21) Appl. No.: 13/220,038

(22) Filed: Aug. 29, 2011

(65) Prior Publication Data

US 2012/0235156 A1 Sep. 20, 2012

(30) Foreign Application Priority Data

Mar. 17, 2011 (JP) .................................. 2011-059547

(51) Int. Cl.
*H01L 29/15* (2006.01)

(52) U.S. Cl.
USPC ..... 257/76; 257/192; 257/E29.264; 257/E45.003; 323/223; 323/224; 327/109; 327/314; 363/19; 363/127; 363/282; 438/216; 438/285; 438/483; 438/518; 438/569

(58) Field of Classification Search
None
See application file for complete search history.

(56) References Cited

U.S. PATENT DOCUMENTS

| 2005/0189561 A1* | 9/2005 | Kinzer et al. | 257/192 |
| 2007/0102727 A1* | 5/2007 | Twynam | 257/194 |
| 2010/0163928 A1* | 7/2010 | Imada et al. | 257/194 |
| 2010/0224910 A1* | 9/2010 | Ando et al. | 257/192 |

FOREIGN PATENT DOCUMENTS

| JP | 63-202075 A | 8/1988 |
| JP | 11-26776 A | 1/1999 |
| JP | 2007-35898 A | 2/2007 |
| JP | 2007-150282 A | 6/2007 |
| JP | 2008-16682 A | 1/2008 |
| JP | 2009-59816 A | 3/2009 |
| JP | 2009-148106 | 7/2009 |
| JP | 2009-530862 | 8/2009 |
| JP | 2010-225962 A | 10/2010 |
| JP | 2010-245550 A | 10/2010 |
| JP | 2011-44647 A | 3/2011 |
| JP | 2012-44078 A | 3/2012 |

OTHER PUBLICATIONS

Japanese Office Action Issued Jan. 30, 2013 in Patent Application No. 2011-059547 (with English translation).

* cited by examiner

*Primary Examiner* — Yasser A Abdelaziez
(74) *Attorney, Agent, or Firm* — Oblon, Spivak, McClelland, Maier & Neustadt, L.L.P.

(57) ABSTRACT

According to one embodiment, a nitride semiconductor device includes a semiconductor layer, a source electrode, a drain electrode, a first and a second gate electrode. The semiconductor layer includes a nitride semiconductor. The source electrode provided on a major surface of the layer forms ohmic contact with the layer. The drain electrode provided on the major surface forms ohmic contact with the layer and is separated from the source electrode. The first gate electrode is provided on the major surface between the source and drain electrodes. The second gate electrode is provided on the major surface between the source and first gate electrodes. When a potential difference between the source and first gate electrodes is 0 volts, a portion of the layer under the first gate electrode is conductive. The first gate electrode is configured to switch a constant current according to a voltage applied to the second gate electrode.

16 Claims, 5 Drawing Sheets

NITRIDE SEMICONDUCTOR DEVICE

CROSS-REFERENCE TO RELATED APPLICATIONS

This application is based upon and claims the benefit of priority from the prior Japanese Patent Application No. 2011-059547, filed on Mar. 17, 2011; the entire contents of which are incorporated herein by reference.

FIELD

Embodiments described herein relate generally to a nitride semiconductor device.

BACKGROUND

In semiconductor devices, it is effective to use a material having a high critical electric field in order to realize high output, high breakage voltage and low ON resistance. Since a nitride semiconductor has the high critical electric field strength, a semiconductor device that realizes high output, high breakdown voltage and low ON resistance can be obtained by using the nitride semiconductor. In nitride semiconductor devices, practical realization of a constant-current operation in a nitride semiconductor device is in demand.

DETAILED DESCRIPTION

Figure 1:
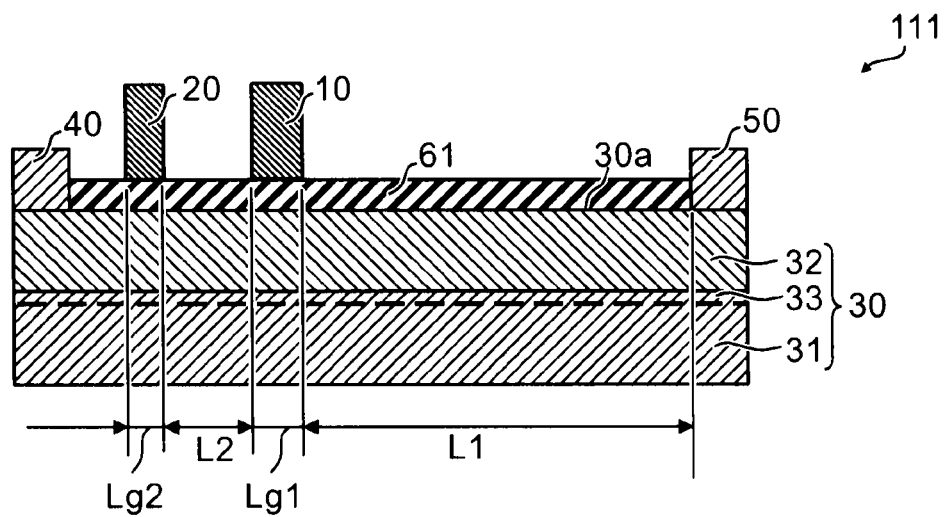
FIG. 1 is a schematic sectional view showing a nitride semiconductor device according to a first embodiment.

In general, according to one embodiment, a nitride semiconductor device includes a semiconductor layer, a source electrode, a drain electrode, a first gate electrode and a second gate electrode. The semiconductor layer includes a nitride semiconductor. The source electrode is provided on a major surface of the semiconductor layer and forms ohmic contact with the semiconductor layer. The drain electrode is provided on the major surface, forms ohmic contact with the semiconductor layer and is separated from the source electrode. The first gate electrode is provided on the major surface between the source electrode and the drain electrode. The second gate electrode is provided on the major surface between the source electrode and the first gate electrode. When a potential difference between the source electrode and the first gate electrode is 0 volts, a portion of the semiconductor layer under the first gate electrode is conductive. The first gate electrode is configured to switch a constant current according to a voltage applied to the second gate electrode.

In general, according to another embodiment, a nitride semiconductor device includes a semiconductor layer, a source electrode, a drain electrode, a first gate electrode and a second gate electrode. The semiconductor layer includes a nitride semiconductor. The source electrode is provided on a major surface of the semiconductor layer and forms ohmic contact with the semiconductor layer. The drain electrode is provided on the major surface, forms ohmic contact with the semiconductor layer and is separated from the source electrode. The first gate electrode is provided on the major surface between the source electrode and the drain electrode. The first gate electrode is configured to operate in a normally-on mode in receiving an AC bias voltage. The second gate electrode is provided on the major surface between the source electrode and the first gate electrode.

In general, according to still another embodiment, a nitride semiconductor device includes a semiconductor layer, a source electrode, a drain electrode, a first gate electrode and a second gate electrode. The source electrode is provided on a major surface of the semiconductor layer and forms ohmic contact with the semiconductor layer. The drain electrode is provided on the major surface, forms ohmic contact with the semiconductor layer and is separated from the source electrode. The first gate electrode is provided on the major surface between the source electrode and the drain electrode. The first gate electrode is configured to operate in a normally-on mode in receiving an AC bias voltage. The second gate electrode is provided on the major surface between the source electrode and the first gate electrode. The semiconductor layer includes a carrier running layer and a carrier supply layer. The carrier supply layer is provided on the carrier running layer and supplies carriers to the carrier running layer. A polarization charge amount in the carrier supply layer is larger than a doping amount in the carrier supply layer. The source electrode, the drain electrode, the first gate electrode, and the second gate electrode are provided on the carrier supply layer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic sectional view illustrating the configuration of a nitride semiconductor device according to a first embodiment.

As illustrated in FIG. 1, the nitride semiconductor device 111 according to the embodiment is provided with a semiconductor layer 30 containing a nitride semiconductor, a source electrode 40, a drain electrode 50, a first gate electrode 10, and a second gate electrode 20.

The semiconductor layer 30 includes a carrier running layer 31 and a carrier supply layer 32, for example. The carrier supply layer 32 is provided on the carrier running layer 31. The carrier running layer 31 contains GaN, for example. The carrier running layer 31 is provided on a buffer layer provided on a substrate, not shown.

The carrier supply layer 32 supplies carriers to the carrier running layer 31. For the carrier supply layer 32, $Al_xGa_{1-x}N$ ($0<x\leq1$), for example, is used. The lattice constant of the carrier supply layer 32 is smaller than the lattice constant of the carrier running layer 31.

As a result, distortion occurs in the carrier supply layer 32. A two-dimensional electron system 33 occurs in an interface between the carrier running layer 31 and the carrier supply layer 32 due to piezo polarization and spontaneous polarization involved in the carrier supply layer 32. In the nitride semiconductor device 111, this two-dimensional electron system 33 is used as a channel.

The source electrode 40 is provided on a major surface 30a of the semiconductor layer 30. The major surface 30a is a surface of the carrier supply layer 32 on the side under the carrier running layer 31. The source electrode 40 forms ohmic contact with the semiconductor layer 30.

The drain electrode 50 is provided on the major surface 30a of the semiconductor layer 30. The drain electrode 50 forms ohmic contact with the semiconductor layer 30. The drain electrode 50 is separated from the source electrode 40.

The first gate electrode 10 is provided on the major surface 30a of the semiconductor layer 30 between the source electrode 40 and the drain electrode 50.

The second gate electrode 20 is provided on the major surface 30a of the semiconductor layer 30 between the source electrode 40 and the first gate electrode 10.

The nitride semiconductor device 111 is further provided with a first insulating layer 61 provided between the semiconductor layer 30 and the first gate electrode 10. For the insulating layer 61, SiN, $SiO_2$, $Al_2O_3$, $Ta_2O_5$ and the like, for example, are used. In this example, the first insulating layer 61 extends between the second gate electrode 20 and the semiconductor layer 30.

For the source electrode 40 and the drain electrode 50 that form ohmic contact with the semiconductor layer 30, Ti, Al, Ta and the like, for example, are used.

The first gate electrode 10 operates in a normally-on mode. That is, when a gate voltage applied to the first gate electrode 10 (first gate voltage) is 0 volts (V), the two-dimensional electron system 33 is present under the first gate electrode 10. That is, when a potential difference between the source electrode 40 and the first gate electrode 10 is 0 V, a portion of the semiconductor layer 30 under the first gate electrode 10 becomes conductive. When the first gate voltage is 0 V, electric current flows between the source electrode 40 and the drain electrode 50. A threshold voltage which shuts off this conductivity is approximately −1 to −20 V, for example. In this example, the second gate electrode 20 also operates in the normally-on mode.

An AC control voltage (first gate voltage) of approximately 1 kHz to 100 MHz is applied to the first gate electrode 10 which operates in the normally-on mode. Then, a DC gate voltage is applied to the second gate electrode 20 as a second gate voltage. The second gate voltage to be applied to the second gate electrode 20 does not necessarily have to be a strict direct current. That is, a change in the second gate voltage with respect to time is smaller than a change in the first gate voltage with respect to time. The second gate voltage may be changed in accordance with a change in a constant current value that is to be obtained by the nitride semiconductor device 111.

Figure 2:
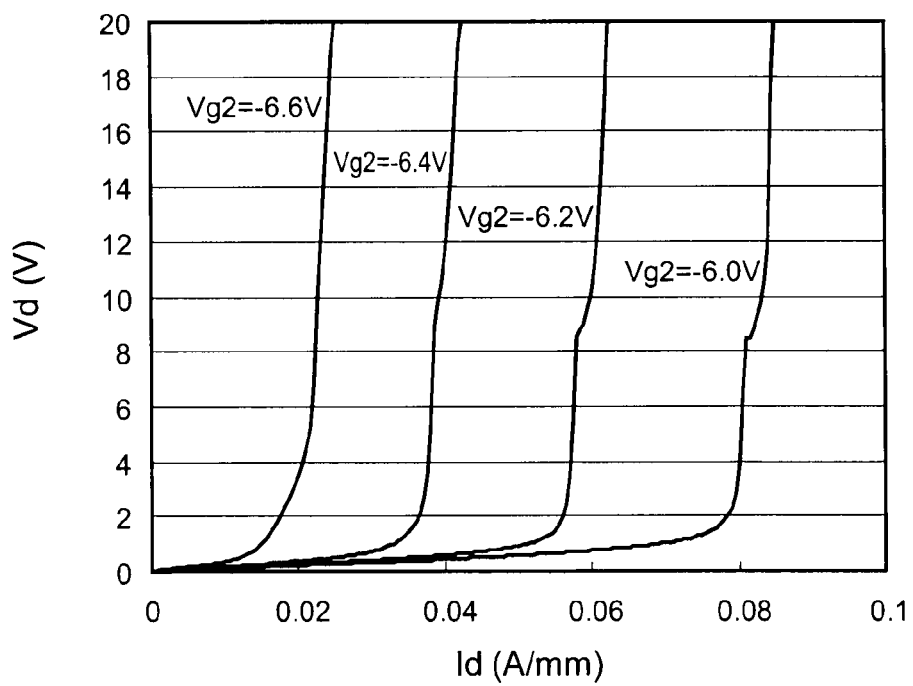
FIG. 2 is a graph showing the operation of the nitride semiconductor device according to the first embodiment.

FIG. 2 is a graph illustrating the operation of the nitride semiconductor device according to the first embodiment.

The figure illustrates drain voltage-drain current characteristics when a gate voltage to be applied to the second gate electrode 20 (the second gate voltage Vg2) is changed in the nitride semiconductor device 111. The horizontal axis indicates a drain current Id, and the vertical axis indicates a drain voltage Vd.

As illustrated in FIG. 2, if the drain current Id is increased, the drain voltage Vd is rapidly raised at a certain current value. The current value at which the drain voltage Vd is raised can be controlled by the second gate voltage Vg2.

This is considered to be because the two-dimensional electron system 33 under the gate electrode is pinched off (that is, depletion occurs), and a current value is limited to a certain value, whereby the drain voltage is raised, for example. That is, the voltage generated in the second gate electrode 20 at the certain current value is transmitted to the drain electrode 50.

As described above, according to the nitride semiconductor device 111 according to the embodiment, a nitride semiconductor device capable of a constant-current operation can be provided. The nitride semiconductor device 111 is also capable of high-speed switching at a high voltage in addition to the above.

Experiments conducted by the inventor in relation with the characteristics of the nitride semiconductor device 111 according to the embodiment will be described below.

Figure 3A:
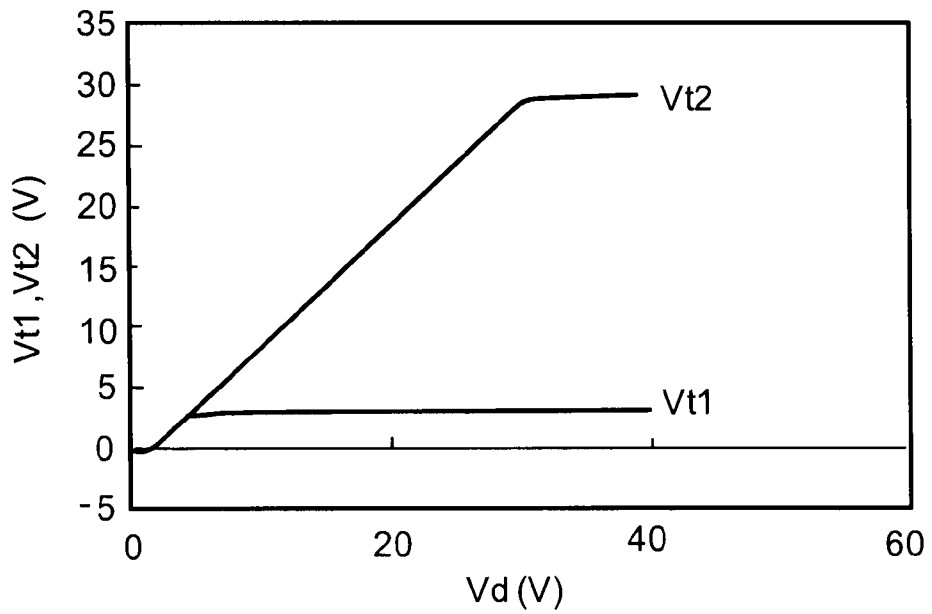
FIG. 3A and FIG. 3B are views showing the characteristics of the nitride semiconductor device according to the first embodiment.
Figure 3B:
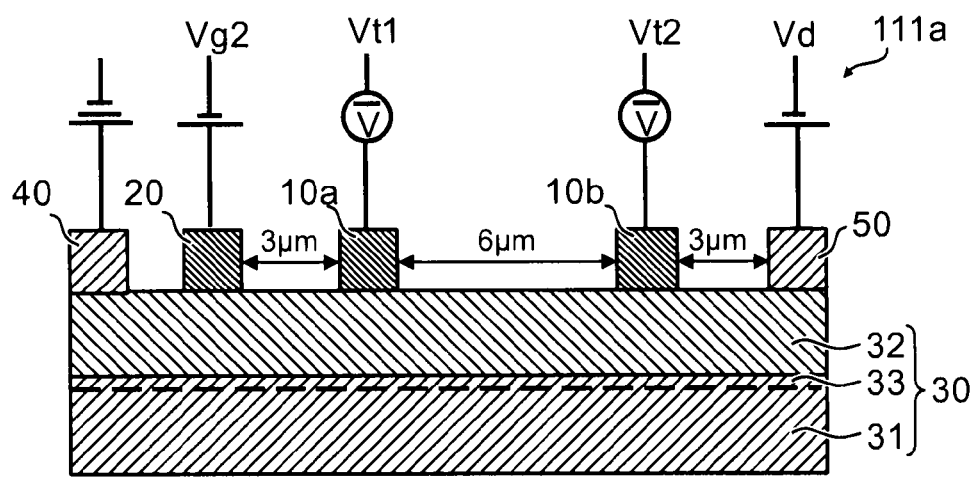

FIG. 3A and FIG. 3B are views illustrating the characteristics of the nitride semiconductor device according to the first embodiment.

FIG. 3A illustrates a measurement result. FIG. 3B illustrates the configuration of a sample used in the experiments.

As illustrated in FIG. 3B, in a sample 111a of this experiment, the semiconductor layer 30 having the carrier running layer 31 and the carrier supply layer 32 formed on the carrier running layer 31 was used. The carrier running layer 31 is a GaN layer. The carrier supply layer 32 is a non-doped $Al_{0.25}Ga_{0.75}N$ layer.

On the semiconductor layer 30, the source electrode 40, the drain electrode 50, and the second gate electrode 20 are provided. Also, two gate electrodes (a first test gate electrode 10a and a second test gate electrode 10b) corresponding to the first gate electrode 10 are provided. The first test gate electrode 10a is provided between the second gate electrode 20 and the drain electrode 50. The second test gate electrode 10b is provided between the first test gate electrode 10a and the drain electrode 50. In this example, the distance between the second gate electrode 20 and the first test gate electrode 10a is 3 micrometers (μm). The distance between the first test gate electrode 10a and the second test gate electrode 10b is 6 μm. The distance between the second test gate electrode 10b and the drain electrode 50 is 3 μm.

In the sample 111a having the above configuration, a voltage was applied to the second gate electrode 20 so that the second gate electrode 20 is brought into the off state. In this state, while the drain voltage Vd is changed, a voltage at the first test gate electrode 10a (voltage Vt1) and a voltage at the second test gate electrode 10b (voltage Vt2) were measured.

FIG. 3A illustrates the measured voltages. The horizontal axis indicates the drain voltage Vd, and the vertical axis indicates the voltage Vt1 and the voltage Vt2.

As illustrated in FIG. 3A, the voltage of the gate voltage (the voltage Vt1 and the voltage Vt2) becomes substantially constant at a certain drain voltage Vd. This is because a depletion layer has reached the gate electrode at the drain voltage Vd.

That is, when the voltage Vt1 becomes substantially constant, the depletion layer reaches the first test gate electrode 10a from the second gate electrode 20. When the voltage Vt2 becomes substantially constant, the depletion layer reaches the second test gate electrode 10b from the second gate electrode 20.

Figure 4:
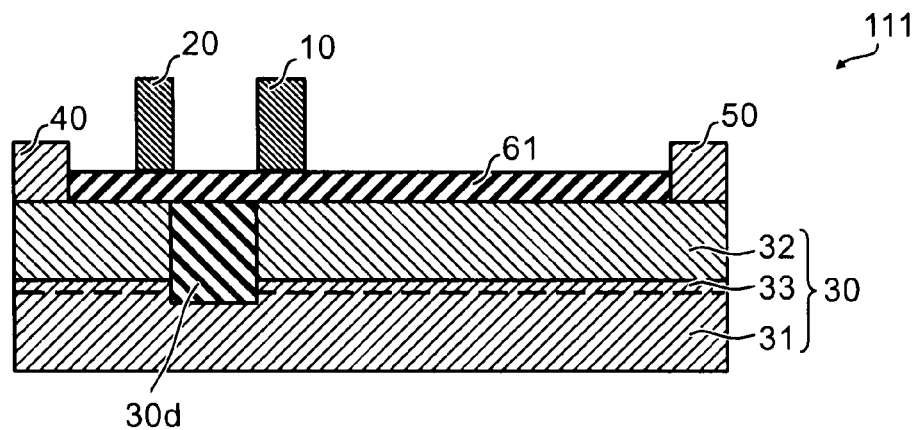
FIG. 4 is a schematic sectional view showing the operation of the nitride semiconductor device according to the first embodiment.

FIG. 4 is a schematic sectional view illustrating the operation of the nitride semiconductor device according to the first embodiment.

As illustrated in FIG. 4, in the nitride semiconductor device 111 according to the embodiment, a depletion layer 30d expands from the end of the second gate electrode 20 on the drain side with rise of the drain voltage Vd. Then, the drain voltage Vd rises, and at a certain value, the depletion layer 30d reaches the end of the first gate electrode 10 on the source side.

As described above, in the nitride semiconductor device 111 according to the embodiment, by applying a DC gate voltage to the second gate electrode 20, the two-dimensional electron system 33 under the second gate electrode becomes depleted when a certain drain current value is reached. Then, the depletion layer 30d expands from the end of the second gate electrode 20 on the drain side and reaches the first gate electrode 10.

A voltage generated on the drain side of the second gate electrode 20 at the certain current value is transmitted to the first gate electrode 10 through the expansion of the depletion layer 30d. The first gate electrode 10 is a gate which operates in the normally-on mode. If the gate voltage applied to the first gate electrode 10 is 0 V, the two-dimensional electron system 33 is present, but by means of the transmitted voltage, the potential of the two-dimensional electron system 33 under the first gate electrode 10 is raised. Thus, the potential of the first gate electrode 10 becomes negative with respect to the two-dimensional electron system 33. The absolute value of the voltage generated at this time exceeds 20V. That is, the voltage having an absolute value not less than the threshold voltage of the first gate electrode 10 is generated. As a result, conductivity under the first gate electrode 10 is shut off.

As described above, in the nitride semiconductor device 111 according to the embodiment, since conductivity under the first gate electrode 10 is shut off at a certain current value or more, switching can be performed at a constant current value.

Since the nitride semiconductor has strong critical electric field strength, even if the gate length is small and even if the distance between the gate electrode and the drain electrode 50 is small, a large breakdown voltage can be obtained. Thus, high-speed and high-voltage switching is made possible with a small gate capacity and a small gate-drain capacity.

As described above, according to the nitride semiconductor device 111 according to the embodiment, a nitride semiconductor device capable of a constant-current operation can be provided. The nitride semiconductor device 111 is also capable of high-speed switching at a high voltage in addition to the above.

If constant-current control is to be performed with a prior-art nitride semiconductor device, it is necessary to read a current value and to control a gate voltage. Thus, high-speed performances are required for a control IC and a control circuit, which is not practical. There can be the configuration in which a merged cascode transistor is formed by a normally-off transistor and a normally-on transistor. However, in this configuration, too, current control cannot be performed. As described above, it is difficult to realize constant-current control in the prior-art nitride semiconductor devices.

On the other hand, as described above, according to the nitride semiconductor device according to the embodiment, a constant-current operation is made possible, and moreover, high-speed switching at a high voltage can be performed.

An example of the configuration with which an appropriate operation can be obtained in the nitride semiconductor device 111 according to the embodiment will be described below.

As described in relation with FIG. 4, in the embodiment, the device is designed so that the depletion layer 30d quickly expands from the second gate electrode 20 to the first gate electrode 10.

The speed at which the depletion layer 30d expands is in inverse proportion to the capacity of the depletion layer 30d and in inverse proportion to doping concentration in a region between the second gate electrode 20 and the first gate electrode 10. A decrease in carrier concentration of the two-dimensional electron system 33 between the second gate electrode 20 and the first gate electrode 10 might cause the higher ON resistance and lower switching efficiency.

Thus, the carrier concentration by polarization is set higher than the doping concentration, for example. As a result, a semiconductor device in which the depletion layer expands quickly and the ON resistance is low can be realized. That is, highly efficient constant-current switching can be realized.

That is, in order to realize high-speed and high-voltage switching at a constant current, a polarization charge amount is set larger than a doping amount in the carrier supply layer 32.

For example, in the experiment described in relation with FIG. 3A and FIG. 3B, when the drain voltage Vd is approximately 5 V, the distance of the expansion of the depletion layer 30d is considered to be 3 μm. Then, when the drain voltage Vd is approximately 30 V, the distance of the expansion of the depletion layer 30d is considered to be 12 μm.

In this example, effective residual doping concentration of the carrier supply layer 32 (non-doped $Al_{0.25}Ga_{0.75}N$ layer) is estimated to be approximately $5\times10^{14}$ cm$^{-3}$. In this example, the film thickness of the carrier supply layer 32 is 30 nanometers (nm). From these facts, the effective residual doping concentration is approximately $1.5\times10^9$ cm$^{-2}$.

On the other hand, the polarization charge amount in $Al_xGa_{1-x}N$ is approximately $x\times5\times10^{13}$ cm$^{-2}$. According to this, the polarization charge amount in $Al_{0.25}Ga_{0.75}N$ is approximately $1.25\times1013$ cm$^{-2}$.

As described above, in this example (the sample 111a), the polarization charge amount is larger than the doping amount. As a result, an appropriate constant-current operation can be realized.

As described above, in the nitride semiconductor device 111 according to the embodiment, the polarization charge amount in the carrier supply layer 32 is set larger than the doping amount in the carrier supply layer 32. As a result, high-speed and high-voltage switching at a constant current is made possible.

In order to obtain this configuration, a nitride semiconductor is used as a semiconductor layer in the embodiment. Moreover, it is desirable to use an AlGaN layer or an InAlN layer having large polarization for the carrier supply layer 32. In the carrier supply layer 32, it is only necessary that the polarization charge amount is larger than the doping amount, and its configuration is arbitrary.

For the carrier supply layer 32, a first layer of a non-doped or n-type $Al_{x1}Ga_{1-x1}N$ ($0<x1\leq1$) can be used, for example.

For the carrier supply layer 32, a second layer of a non-doped or n-type $In_{y1}Al_{1-y1}N$ (0<y1≤1) can be used. For the carrier supply layer 32, a third layer of a non-doped or n-type $Al_{x2}In_{y2}Ga_{1-x2-y2}N$ (0<x2<1, 0<y2<1) can be used. Moreover, for the carrier supply layer 32, a laminate body including at least two of the first layer, the second layer and the third layer can be used. Furthermore, for the carrier supply layer 32, a laminate body including a non-doped or n-type GaN layer and at least one of the first layer, the second layer, and the third layer can be used. Still further, at least one of them can be included.

For the carrier running layer 31, not only a GaN single layer but a double-heterostructure, a superlattice structure or a layered structure with a changed composition ratio may be used.

An example of the configuration of the nitride semiconductor device 111 according to the embodiment will be further described.

As described above, in the nitride semiconductor device 111, in order to obtain the constant-current operation, the configuration in which when a certain current value is reached, a voltage is generated quickly and conductivity in the first gate electrode 10 is shut off is applied.

For example, the operation of the second gate electrode 20 that generates a voltage is preferably performed at a higher speed than the operation of the first gate electrode 10.

For that purpose, as illustrated in FIG. 1, the gate length Lg2 of the second gate electrode 10 is preferably not longer than the gate length Lg1 of the first gate electrode 10.

In order for the second gate electrode 20 to operate at a high speed, it is effective to raise transconductance of the second gate electrode 20. That is, the transconductance of the second gate electrode 20 is preferably not less than the transconductance of the first gate electrode 10. Improvement in the transconductance of the second gate electrode 20 improves controllability of carrier density and enables a high-speed operation. The transconductance can be measured by measuring a change rate of the drain current Id when a voltage applied to the first gate electrode 10 or the second gate electrode 20 is changed in a state in which the source electrode 40 is grounded and a certain voltage is applied to the drain electrode 50.

In the nitride semiconductor device according to the embodiment, high breakdown voltage properties are given between the first gate electrode 10 and the drain electrode 50. On the other hand, though high-speed properties are required for the second gate electrode 20, high breakdown voltage properties are not necessarily required.

As illustrated in FIG. 1, for example, the distance between the first gate electrode 10 and the second gate electrode 20 (second distance L2) is shorter than the distance between the drain electrode 50 and the first gate electrode 10 (first distance L1). As a result, high speed properties can be given to the second gate electrode 20. As a result, while high breakdown voltage properties are obtained between the first gate electrode 10 and the drain electrode 50, high speed properties can be obtained for the second gate electrode 20. As a result, constant-current, high-voltage and high-speed switching is made possible.

Figure 5:
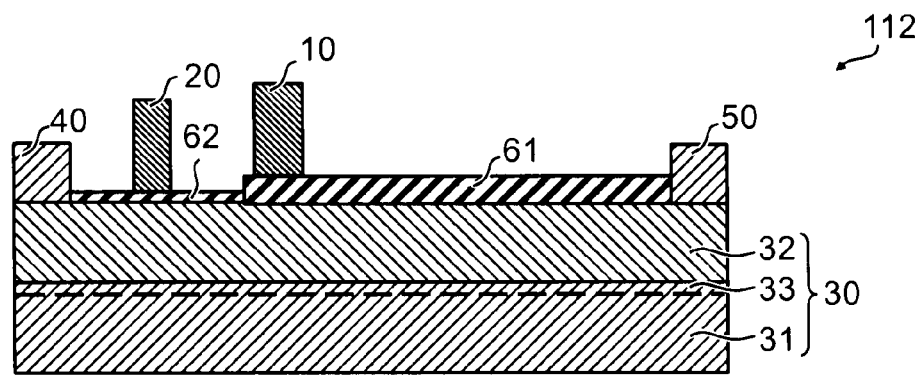
FIG. 5 is a schematic sectional view showing another nitride semiconductor device according to the first embodiment.

FIG. 5 is a schematic sectional view illustrating the configuration of another nitride semiconductor device according to the first embodiment.

As illustrated in FIG. 5, in another nitride semiconductor device 112 according to the embodiment, the thickness of an insulating layer (second insulating layer 62) between the second gate electrode 20 and the semiconductor layer 30 is different from the thickness of an insulating layer (first insulating layer 61) between the first gate electrode 10 and the semiconductor layer 30. Specifically, the thickness of the second insulating layer 62 is smaller than the thickness of the first insulating layer 61. Since the other configurations are the same as those in the nitride semiconductor device 111, the description will be omitted.

By setting the thickness of the second insulating layer 62 smaller than the thickness of the first insulating layer 61, carrier density controllability of the second gate electrode 20, for example, is improved. Also, the transconductance of the second gate electrode 20 can be made larger than the transconductance of the first gate electrode 10.

Also, the material of the second insulating layer 62 may be changed from the material of the first insulating layer 61 so as to change dielectric constants of the insulating layers. For example, relative dielectric constant of the second insulating layer 62 may be set larger than the relative dielectric constant of the first insulating layer 61. As a result, the transconductance of the second gate electrode 20 can be made larger than the transconductance of the first gate electrode 10.

Figure 6:
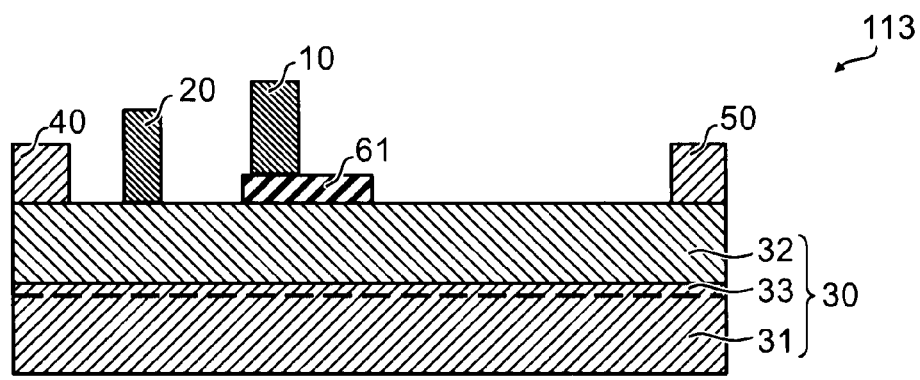
FIG. 6 is a schematic sectional view showing another nitride semiconductor device according to the first embodiment.

FIG. 6 is a schematic sectional view illustrating the configuration of another nitride semiconductor device according to the first embodiment.

As illustrated in FIG. 6, in another nitride semiconductor device 113 according to the embodiment, no insulating layer is provided between the second gate electrode 20 and the semiconductor layer 30. The second gate electrode 20 forms Schottky connection with the semiconductor layer 30. Since the other configurations are the same as those of the nitride semiconductor device 111, the description will be omitted.

For the second gate electrode 20, Ni, Pt, Pd or the like is used. As a result, the second gate electrode 20 forms Schottky connection with the semiconductor layer 30.

The second gate electrode 20 requires high speed properties but does not necessarily require high breakdown voltage. Thus, an insulating layer between the second gate electrode 20 and the semiconductor layer 30 may be omitted. As a result, controllability of the second gate electrode 20 can be improved. As a result, the transconductance of the second gate electrode 20 can be made larger.

Figure 7:
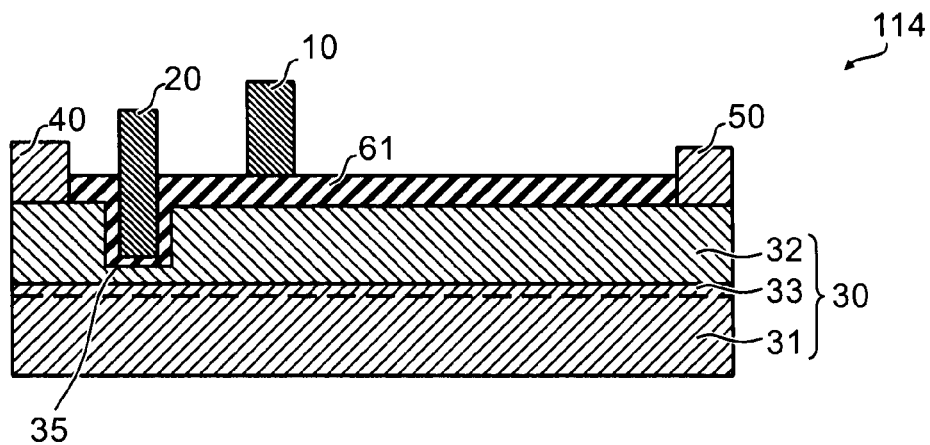
FIG. 7 is a schematic sectional view showing another nitride semiconductor device according to the first embodiment.

FIG. 7 is a schematic sectional view illustrating the configuration of another nitride semiconductor device according to the first embodiment.

As illustrated in FIG. 7, in another nitride semiconductor device 114 according to the embodiment, a recess 35 is provided in the semiconductor layer 30. In the recess 35, (at least) a part of the second gate electrode 20 is embedded. The first insulating layer 61 extends between the second gate electrode 20 and the semiconductor layer 30. Since the other configurations are the same as those of the nitride semiconductor device 111, the description will be omitted.

In this example, the first insulating layer 61 extending between the second gate electrode 20 and the semiconductor layer 30 corresponds to the second insulating layer provided between the recess 35 of the semiconductor layer 30 and the second gate electrode 20.

By means of the configuration in which (at least) a part of the second gate electrode 20 is embedded in the recess 35, carrier density controllability of the second gate electrode 20 can be improved. As a result, the transconductance of the second gate electrode 20 can be made larger.

In the nitride semiconductor device 111 illustrated in FIG. 1, the structure between the first gate electrode 10 and the semiconductor layer 30 is the same as the structure between the second gate electrode 20 and the semiconductor layer 30. Thus, similarly to the normally-on mode operation of the first gate electrode 10, the second gate electrode 20 also operates in the normally-on mode. By allowing the first gate electrode 10 and the second gate electrode 20 to operate in the normally-on mode as above, the structure is simplified, and fabrication is facilitated. Also, since the carrier density in the two-dimensional electron system 33 under the second gate electrode 20 is not different from the other spots, current driving capacity is high. Then, the ON resistance becomes low. As a result, efficient switching is made possible. Also, it is not necessary to prepare positive bias for the DC gate voltage to be applied to the second gate electrode 20. However, the embodiment is not limited to that, and the second gate electrode 20 may operate in the normally-off mode.

Figure 8:
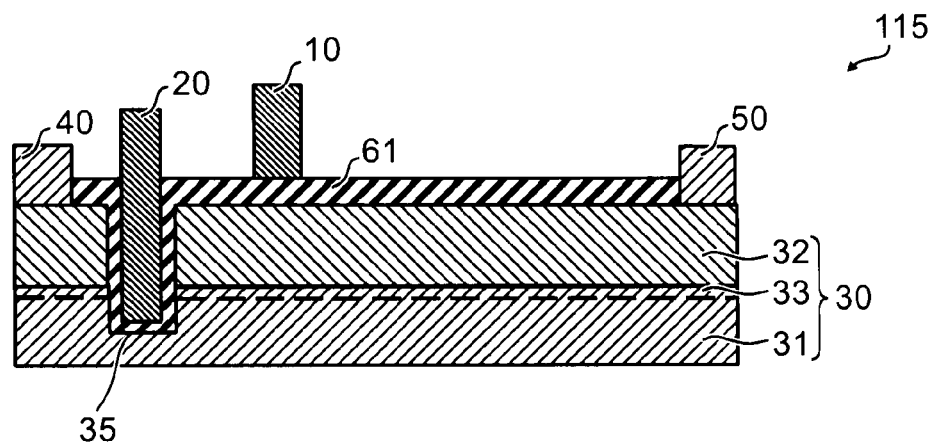
FIG. 8 is a schematic sectional view showing another nitride semiconductor device according to the first embodiment.

FIG. 8 is a schematic sectional view illustrating the configuration of another nitride semiconductor device according to the first embodiment.

As illustrated in FIG. 8, in another nitride semiconductor device 115 according to the embodiment, the recess 35 is provided in the semiconductor layer 30. The recess 35 penetrates the carrier supply layer 32 and reaches the carrier running layer 31. In the recess 35, (at least) a part of the second gate electrode 20 is embedded. Between the second gate electrode 20 and the semiconductor layer 30, the first insulating layer 61 extends. Since the other configurations are the same as those of the nitride semiconductor device 111, the description will be omitted.

As described above, the recess 35 is provided in the carrier supply layer 32 under the second gate electrode 20, and the recess 35 penetrates the carrier supply layer 32 and reaches the carrier running layer 31. As a result, the two-dimensional electron system 33 under (near) the second gate electrode 20 is depleted. As a result, the second gate electrode 20 operates in the normally-off mode. As a result, it is not necessary to prepare a power supply which generates negative bias to apply the DC gate voltage to the second gate electrode 20.

Figure 9:
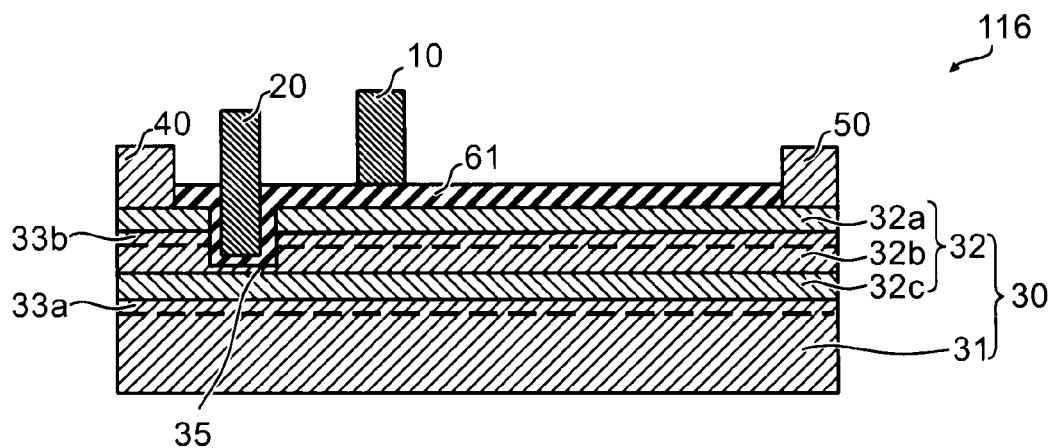
FIG. 9 is a schematic sectional view showing another nitride semiconductor device according to the first embodiment.

FIG. 9 is a schematic sectional view illustrating the configuration of another nitride semiconductor device according to the first embodiment.

As illustrated in FIG. 9, in another nitride semiconductor device 116 according to the embodiment, the carrier supply layer 32 of the semiconductor layer 30 has a laminate structure. The recess 35 is provided in the semiconductor layer 30. Since the other configurations are the same as those of the nitride semiconductor device 111, the description will be omitted.

In this example, the carrier supply layer 32 has a first supply layer 32a, a second supply layer 32b, and a third supply layer 32c. The second supply layer 32b is provided between the first supply layer 32a and the third supply layer 32c. The third supply layer 32c is provided between the second supply layer 32b and the carrier running layer 31. For the first supply layer 32a, an AlGaN layer, for example, is used. For the second supply layer 32b, a GaN layer, for example, is used. For the third supply layer 32c, an AlGaN layer, for example, is used.

A two-dimensional electron system 33a is formed in the interface between the carrier running layer 31 and the third supply layer 32c. A two-dimensional electron system 33b is formed in the interface between the second supply layer 32b and the first supply layer 32a.

The bottom part of the recess 35 reaches the second supply layer 32b but does not reach the third supply layer 32c. Thus, there is no two-dimensional electron system under the second gate electrode 20. As a result, in the second electrode 20, the ON resistance of a portion under the second gate electrode 20 can be reduced while the normally-off mode operation is realized.

Also, by means of this configuration, a ratio of fluctuation in the threshold voltage that shuts off conductivity in the portion under the second gate electrode 20 with respect to the fluctuation in the recess depth under the second gate electrode 20 can be made smaller. That is, working accuracy of the recess depth under the second gate electrode 20 can be relaxed. As a result, in the portion under the second gate electrode 20, the ON resistance is low, and the normally-off mode operation is performed. Also, it is not necessary to prepare a power supply which generates negative bias to apply the DC gate voltage to the second gate electrode 20.

In the embodiment, the normally-off mode operation can be also obtained by introducing fluorine into the insulating layer (second insulating layer 62) between the second gate electrode 20 and the semiconductor layer 30.

By allowing the second gate electrode 20 to operate in the normally-off mode, it is no longer necessary to prepare a power supply which generates negative bias as the DC gate voltage to apply to the second gate electrode 20. In the embodiment, in order for the second gate electrode 20 to operate in the normally-off mode, various methods other than the above can be used.

Figure 10:
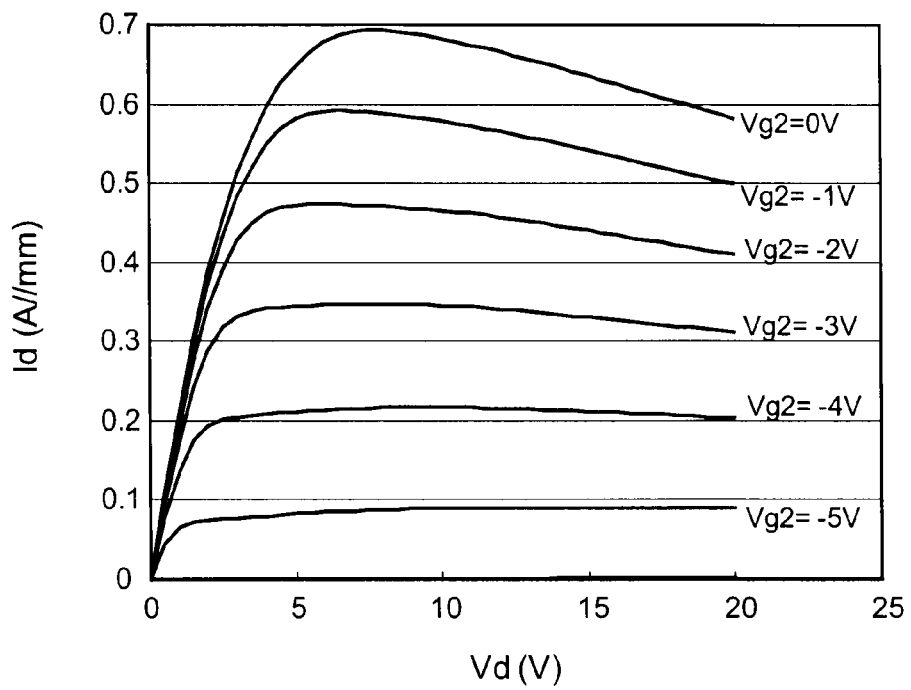
FIG. 10 is a graph showing characteristics of a nitride semiconductor device according to the first embodiment.

FIG. 10 is a graph illustrating characteristics of the nitride semiconductor device according to the first embodiment.

The figure illustrates an example of a measurement result of the drain voltage Vd-drain current Id characteristics when the source electrode 40 is grounded, and the second gate voltage Vg2 is changed in the nitride semiconductor device 111 illustrated in FIG. 1.

As illustrated in FIG. 10, there is a region showing negative differential resistance in which the drain current Id is decreased when the drain voltage Vd is increased. By employing the configuration of the transistor having such negative differential resistance characteristics for the second gate electrode 20, the constant-current characteristics are further stabilized.

That is, if a certain current value is reached in a state in which a certain DC voltage is applied to the second gate electrode 20, the drain voltage Vd is raised. At this time, if the second gate electrode 20 has the negative differential resistance characteristics, the drain current Id decreases if the drain voltage Vd rises. Thus, high speed properties to shut off conductivity in the first gate electrode 10 are further improved. As a result, highly efficient switching is made possible.

Whether or not the negative differential resistance appears can be determined by measurement of the drain voltage-drain current characteristics by grounding the source electrode 40 and by applying a certain DC voltage to the second gate electrode 20.

Second Embodiment

Figure 11:
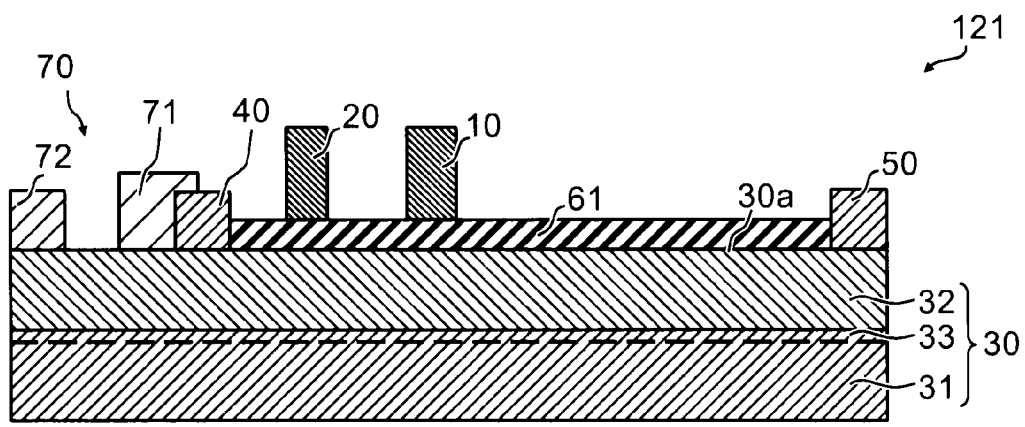
FIG. 11 is a schematic sectional view showing a nitride semiconductor device according to a second embodiment.

FIG. 11 is a schematic sectional view illustrating the configuration of a nitride semiconductor device according to a second embodiment.

As illustrated in FIG. 11, a nitride semiconductor device 121 according to the embodiment is further provided with a diode 70 in addition to the semiconductor layer 30, the source electrode 40, the drain electrode 50, the first gate electrode 10, and the second gate electrode 20. The diode 70 is electrically connected to either of the source electrode 40 and the drain electrode 50. In this example, the diode 70 is connected to the source electrode 40.

The diode 70 includes a part of the semiconductor layer 30. The diode 70 is formed with a part of the semiconductor layer 30. That is, the diode 70 is a nitride diode.

For example, the diode 70 includes a first diode electrode 71 and a second diode electrode 72. The first diode electrode 71 and the second diode electrode 72 are provided on the semiconductor layer 30 (specifically, the carrier supply layer 32). In this example, the first diode electrode 71 is in contact with the source electrode 40.

For example, the first diode electrode 71 forms Schottky contact with the semiconductor layer 30 (specifically, the carrier supply layer 32). For the first diode electrode 71, Ni, Pt and Pd or the like is used. As a result, the Schottky contact is formed.

That is, the diode 70 is provided on the major surface 30a of the semiconductor layer 30 and includes the first diode electrode 71 electrically connected to either of the source electrode 40 and the drain electrode 50 and the second diode electrode 72 provided on the major surface 30a. Either of the first diode electrode 71 and the second diode electrode 72 forms Schottky contact with the semiconductor layer 30. As described above, in the nitride semiconductor device 121, the nitride diode formed by the semiconductor layer 30 including the nitride semiconductor is formed on the substrate (semiconductor layer 30) on which the source electrode 40 and the drain electrode 50 are provided.

In the nitride semiconductor device 121, a switching portion capable of a constant-current operation and a nitride diode that imparts rectifying properties can be fabricated on the same substrate, and a nitride semiconductor device having an electric power conversion function with a constant current and capable of high-speed switching can be provided.

According to the embodiment, a nitride semiconductor device capable of a constant-current operation is provided.

Some embodiments have been described by referring to the specific examples. However, the embodiments are not limited to these specific examples. For example, one skilled in the art may similarly practice the invention by appropriately selecting specific configurations of components included in the nitride semiconductor device such as nitride semiconductor layers, electrodes, insulating layers and the like from known art. Such practice is included in the scope of the invention to the extent that similar effects thereto can be obtained.

Further, any two or more components of the specific examples may be combined within the extent of technical feasibility and are included in the scope of the invention to the extent that the purport of the invention is included.

Moreover, all nitride semiconductor devices practicable by an appropriate design modification by one skilled in the art based on the nitride semiconductor devices described above as embodiments also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device comprising:
a semiconductor layer including a nitride semiconductor;
a source electrode provided on a major surface of the semiconductor layer and forming ohmic contact with the semiconductor layer;
a drain electrode provided on the major surface, forming ohmic contact with the semiconductor layer and separated from the source electrode;
a first gate electrode provided on the major surface between the source electrode and the drain electrode;
a second gate electrode provided on the major surface between the source electrode and the first gate electrode; and
an insulating layer provided between the major surface of the semiconductor layer and the first gate electrode and between the major surface of the semiconductor layer and the second gate electrode, wherein
when a potential difference between the source electrode and the first gate electrode is 0 volts, a portion of the semiconductor layer under the first gate electrode is conductive,
the second gate electrode is configured to receive a DC applied voltage to generate a constant DC current,
the first gate electrode is configured to switch a constant current according to a voltage applied to the second gate electrode,
a gate length of the second gate electrode is less than a gate length of the first gate electrode,
a transconductance of the second gate electrode is more than a transconductance of the first gate electrode, and
a distance between the first gate electrode and the second gate electrode is shorter than a distance between the drain electrode and the first gate electrode.

2. The device according to claim 1, wherein
the semiconductor layer includes:
a carrier running layer including GaN; and
a carrier supply layer provided on the carrier running layer,
the source electrode, the drain electrode, the first gate electrode, and the second gate electrode are provided on the carrier supply layer,
the carrier supply layer includes at least one of
a first layer made of a non-doped or n-type $Al_{x1}Ga_{1-x1}N$ ($0<x1\leq1$),
a second layer of a non-doped or n-type $In_{y1}Al_{1-y1}N$ ($0<y1\leq1$),
a third layer of a non-doped or n-type $Al_{x2}In_{y2}Ga_{1-x2-y2}N$ ($0<x2<1, 0<y2<1$),
a laminate body including at least two of the first layer, the second layer, and the third layer, and
a laminate body including a non-doped or n-type GaN layer and at least one of the first layer, the second layer, and the third layer.

3. The device according to claim 1, wherein
when a DC gate bias is applied to the second gate electrode, a drain current shows negative differential resistance.

4. The device according to claim 1, further comprising:
a diode formed with a part of the semiconductor layer and being electrically connected to one of the source electrode and the drain electrode.

5. The device according to claim 4, wherein
the diode includes:
a first diode electrode provided on the major surface and electrically connected to one of the source electrode and the drain electrode; and
a second diode electrode provided on the major surface, one of the first diode electrode and the second diode electrode forms Schottky contact with the semiconductor layer.

6. The device according to claim 1, further comprising an insulating layer, a recess being provided in the major surface of the semiconductor layer, at least a part of the second gate electrode being embedded in the recess, and the insulating layer being disposed between the recess in the semiconductor layer and the second gate electrode.

7. The device according to claim 6, wherein
the semiconductor layer includes:
- a carrier running layer including GaN; and
- a carrier supply layer provided on the carrier running layer, the source electrode, the drain electrode, the first gate electrode, and the second gate electrode are provided on the carrier supply layer, and the recess penetrates the carrier supply layer to reach the carrier running layer.

8. A nitride semiconductor device comprising:
a semiconductor layer including a nitride semiconductor;
a source electrode provided on a major surface of the semiconductor layer and forming ohmic contact with the semiconductor layer;
a drain electrode provided on the major surface, forming ohmic contact with the semiconductor layer and separated from the source electrode;
a first gate electrode provided on the major surface between the source electrode and the drain electrode, the first gate electrode being configured to operate in a normally-on mode in receiving an AC bias voltage;
a second gate electrode provided on the major surface between the source electrode and the first gate electrode; and
an insulating layer provided between the major surface of the semiconductor layer and the first gate electrode and between the major surface of the semiconductor layer and the second gate electrode, wherein
the second gate electrode is configured to receive a DC applied voltage to generate a constant DC current,
a gate length of the second gate electrode is less than a gate length of the first gate electrode,
a transconductance of the second gate electrode is more than a transconductance of the first gate electrode, and
a distance between the first gate electrode and the second gate electrode is shorter than a distance between the drain electrode and the first gate electrode.

9. The device according to claim 8, wherein
the semiconductor layer includes:
- a carrier running layer including GaN; and
- a carrier supply layer provided on the carrier running layer, the source electrode, the drain electrode, the first gate electrode, and the second gate electrode are provided on the carrier supply layer, the carrier supply layer includes at least one of
- a first layer made of a non-doped or n-type $Al_{x1}Ga_{1-x1}N$ ($0<x1\leq1$),
- a second layer of a non-doped or n-type $In_{y1}Al_{1-y1}N$ ($0<y1\leq1$),
- a third layer of a non-doped or n-type $Al_{x2}In_{y2}Ga_{1-x2-y2}N$ ($0<x2<1, 0<y2<1$),
- a laminate body including at least two of the first layer, the second layer, and the third layer, and
- a laminate body including a non-doped or n-type GaN layer and at least one of the first layer, the second layer, and the third layer.

10. The device according to claim 8, wherein
when a DC gate bias is applied to the second gate electrode, a drain current shows negative differential resistance.

11. The device according to claim 8, further comprising:
a diode including a part of the semiconductor layer and being electrically connected to one of the source electrode and the drain electrode.

12. The device according to claim 11, wherein
the diode includes:
- a first diode electrode provided on the major surface and electrically connected to one of the source electrode and the drain electrode; and
- a second diode electrode provided on the major surface, one of the first diode electrode and the second diode electrode forms Schottky contact with the semiconductor layer.

13. The device according to claim 8, further comprising an insulating layer,
a recess being provided in the major surface of the semiconductor layer,
at least a part of the second gate electrode being embedded in the recess, and
the insulating layer being provided between the recess in the semiconductor layer and the second gate electrode.

14. The device according to claim 13, wherein
the semiconductor layer includes:
- a carrier running layer including GaN; and
- a carrier supply layer provided on the carrier running layer, the source electrode, the drain electrode, the first gate electrode, and the second gate electrode are provided on the carrier supply layer, and the recess penetrates the carrier supply layer to reach the carrier running layer.

15. A nitride semiconductor device comprising:
a semiconductor layer;
a source electrode provided on a major surface of the semiconductor layer and forming ohmic contact with the semiconductor layer;
a drain electrode provided on the major surface, forming ohmic contact with the semiconductor layer and separated from the source electrode;
a first gate electrode provided on the major surface between the source electrode and the drain electrode, the first gate electrode being configured to operate in a normally-on mode in receiving an AC bias voltage;
a second gate electrode provided on the major surface between the source electrode and the first gate electrode; and
an insulating layer provided between the major surface of the semiconductor layer and the first gate electrode between the major surface of the semiconductor layer and the second gate electrode,
the semiconductor layer including:
- a carrier running layer; and
- a carrier supply layer provided on the carrier running layer and supplying carriers to the carrier running layer, a polarization charge amount in the carrier supply layer being larger than a doping amount in the carrier supply layer, the source electrode, the drain electrode, the first gate electrode, and the second gate electrode being provided on the carrier supply layer, wherein the second gate electrode is configured to receive a DC applied voltage to generate a constant DC current, a gate length of the second gate electrode is less than a gate length of the first gate electrode, a transconductance of the second gate electrode is more than a transconductance of the first gate electrode, and a distance between the first gate electrode and the second gate electrode is shorter than a distance between the drain electrode and the first gate electrode.

16. The device according to claim 15, wherein the carrier supply layer includes at least one of
- a first layer made of a non-doped or n-type $Al_xGa_{1-x1}N$ ($0<x1\leq1$),
- a second layer of a non-doped or n-type $In_{y1}Al_{1-y1}N$ ($0<y1\leq1$),
- a third layer of a non-doped or n-type $Al_{x2}In_{y2}Ga_{1-x2-y2}N$ ($0<x2<1$, $0<y2<1$),
- a laminate body including at least two of the first layer, the second layer, and the third layer, and
- a laminate body including a non-doped or n-type GaN layer and at least one of the first layer, the second layer, and the third layer.

* * * * *